Nov. 24, 1964 D. M. LAUDERDALE 3,158,817

FREQUENCY RESPONSIVE APPARATUS WITH DUAL OUTPUT FILTER

Filed Aug. 30, 1961 3 Sheets-Sheet 1

INVENTOR
DONALD M. LAUDERDALE

W. O. Quesenberry
Claude Funkhouser
ATTORNEYS

BY
Leonard L. Lourie
AGENT

FREQUENCY RESPONSIVE APPARATUS WITH DUAL OUTPUT FILTER

Filed Aug. 30, 1961 3 Sheets-Sheet 2

PLOT OF VECTOR AMPLITUDES

INVENTOR
DONALD M. LAUDERDALE
BY W. O. Quesenberry
Claude Funkhouser
ATTORNEYS
Leonard L. Lourie
AGENT INVENTOR
DONALD M. LAUDERDALE
W. O. Quesenberry
Claude Funkhouser
BY ATTORNEYS
Leonard L. Lourie
AGENT 3,158,817

FREQUENCY RESPONSIVE APPARATUS WITH DUAL OUTPUT FILTER

Donald M. Lauderdale, Austin, Tex., assignor to the United States of America as represented by the Secretary of the Navy Filed Aug. 30, 1961, Ser. No. 135,086
8 Claims. (Cl. 329—119)

Figure 1:
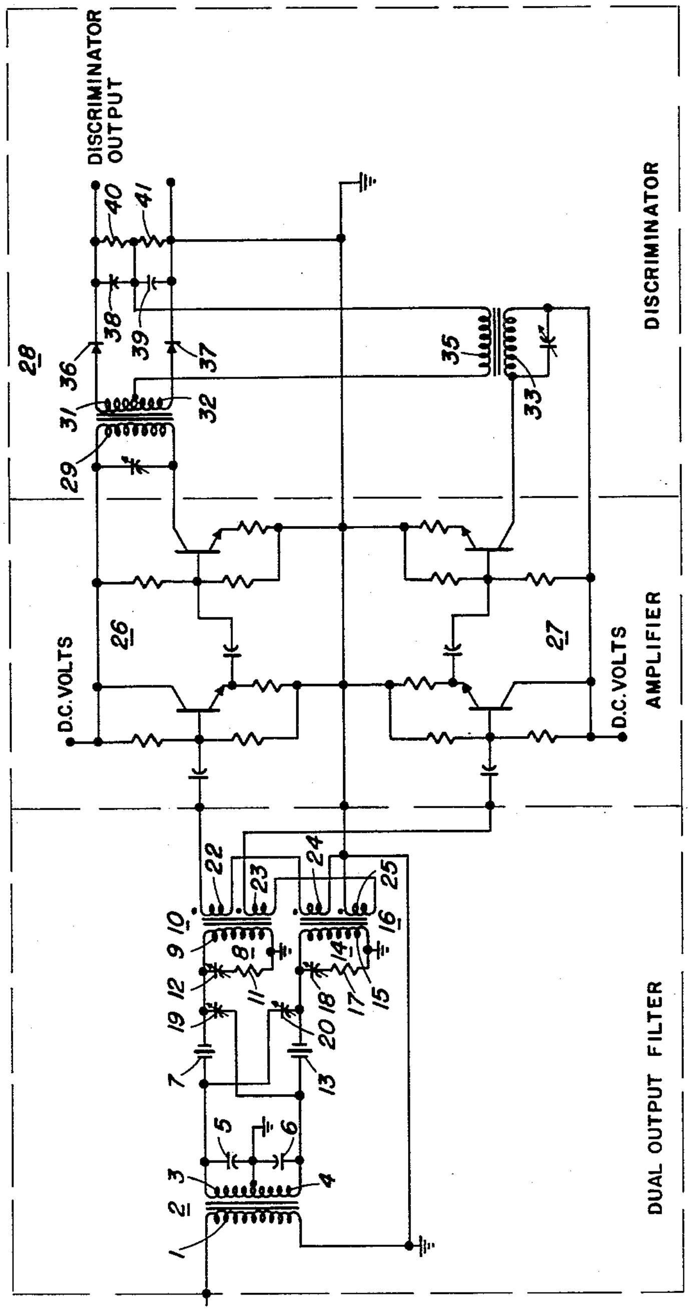

The present invention relates generally to frequency responsive circuits and more particularly to a new and improved filter system for providing highly sensitive frequency discrimination in systems having low signal-to-noise ratios.

In many frequency discrimination systems which produce an output that is proportional in amplitude to the change in frequency of an input signal, great difficulty is encountered in securing sufficient sensitivity due to the low signal-to-noise ratio present with signals of small amplitude. The use of a Foster-Seeley type discriminator that requires one input signal to be shifted ninety degrees out of phase with respect to the other input is well known to those skilled in the art. One way of utilizing this type of phase discriminator is to connect the incoming signal directly to the discriminator as a reference input signal and the output of a filter circuit which has phased shifted the incoming signal as the other input signal to the discriminator. The signal to the discriminator taken from the filter output changes in phase within the passband of the filter as a function of the frequency of the incoming signal to the filter and the incoming signal directly connected to the discriminator taken from the filter input remains constant in-phase over the passband of the filter. The relative change of phase with frequency between these two input signals to the discriminator then provides a discriminator output signal that changes in amplitude as a function of input frequency. The D.C. output from the phase discriminator circuit is proportional to filter input frequencies.

There are several disadvantages to the above-described technique. Since one input to the discriminator is obtained from the input to the filter and does not pass through the filter, it contains necessarily a bandwidth of noise determined by the other circuit elements. There are systems in which it is desirable to make use of signal levels that are near the maximum noise level present in the system. It becomes important to maintain the band pass for noise at least as narrow as the band pass determined by the signal requirements of the system. If such a system includes a filter and discriminator as described above, the noise present at the discriminator is not at a minimum unless both the reference signal and the filter output signal have passed through a filter having the same equivalent characteristic.

It would appear that this disadvantage could be eliminated by making use of two filters of the same bandwidth and passing each input to the discriminator through one of these filters with the end result that each input to the discriminator can be supplied with a signal that has associated with it the same average amount of noise. However, this procedure is not satisfactory unless the response of the two filters to environmental conditions of temperature, moisture, vibration, and etc., is the same. A relative phase shift between the two filters because of environmental effects will cause bias voltages to be developed at the output of the discriminator. These undesirious effects, except that due to temperature, could be reduced in most cases to negligible values. The effect of changes in temperature in the case of crystal filters is particularly more difficult to eliminate. Even quartz crystals of the same cut tend to exhibit differences such as a drift in their frequency upon the variation of temperature. Careful selection and matching of crystals would reduce these differences but, of course, this is not a desirable production procedure.

A possible solution to the dilemma would be the use of two filters, one with a wider bandwidth than the other. The filter with the wider bandwidth would allow for a certain amount of frequency drift between the two filters. But this has a further disadvantage that additional noise equal in extent to the greater bandwidth would again be present in the discriminator. A further disadvantage to a system using two filters is the need to provide the extra elements required by the second filter. In many systems the space and weight of the additional elements have become very critical requirements.

Therefore, it is an object of the present invention to provide a new and improved filter system for providing highly sensitive frequency discrimination in systems having low signal-to-noise ratio.

A further object of the present invention is to provide a dual output filter which is not affected by environmental conditions such as temperature, moisture, and vibration.

Still a further object of the present invention is to provide a dual output filter wherein the outputs are inherently at a ninety degree phase relationship at the mid-frequency of the input signal.

Still another object of the present invention is to provide a dual output filter of such a nature as to provide a dual signal useable in a Foster-Seeley type discriminator at relatively inexpensive cost with a minimum number of circuit elements.

Figure 3:
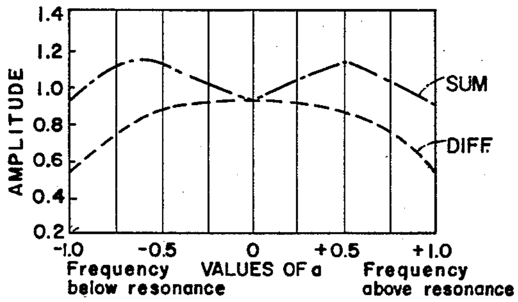

Other objects and many of the attendant advantages of this invention will be readily appreciated as the same becomes better understood by reference to the following detailed description when considered in connection with the accompanying drawings wherein:

FIG. 1 is a complete schematic diagram of an embodiment of the present invention;

FIGS. 2*a* through 2*e* show vector diagrams showing the phase relationship of the outputs of the filter section of the present invention as the frequency of the input signal varies from below to above the center frequency of the filter;

FIG. 3 shows a plot of vector amplitudes of the sum and difference voltages above and below center frequency of the filter circuit; and FIGS. 4*a* through 4*e* show the voltage vector diagrams across various circuit elements of the discriminator section of FIG. 1 as the frequency of the input signal varies above and below the center frequency of the filter.

Referring to FIG. 1 of the drawings, there is shown an embodiment of the present invention of a dual output filter supplying at filter center dual output signals in quadrature to a transistor amplifier-discriminator circuit.

The frequency modulated input signal is fed to the primary 1 of transformer 2. The center tap of the secondary winding 3, 4 of transformer 2 is connected to ground. Each half of the secondary winding 3 and 4, respectively, is shunted by capacitors 5 and 6, respectively, to balance out any stray capacitance. Across the secondary winding 3 there is connected a crystal 7 in series with a tuned circuit 8 which comprises a primary winding 9 of transformer 10, resistor 11 and capacitor 12. Similarly, crystal 13 in series with tuned circuit 14 comprising primary winding 15 of transformer 16, resistor 17 and capacitor 18 is connected across the secondary winding 4 of transformer 2.

By definition, the Q of a tuned circuit or resonant system is equal to the reactance divided by the resistance of the circuit. The resistors 11 and 17 determine Q of the tank circuits 8 and 14, respectively, and consequently the Q of the crystals 7 and 13, respectively. The capacitors 19 and 20, respectively, are connected across the crystals 7 and 13, respectively, and the secondary of the transformer 2 and serve to shift the antiresonance of the crystals 7 and 13.

Separate signals from each of the crystals 7 and 13 are transferred to the tuned circuits 8 and 14, respectively. The signal developed across primary 9 of transformer 10 is coupled to two secondary windings or coils 22 and 23. The signal developed across primary 15 of tuned circuit 14 is coupled to two secondary windings or coils 24 and 25 of transformer 16. Considering the dots to indicate instantaneous polarity of each winding, it is seen that the transformer windings 22 and 24 are connected to add vectorially while windings 23 and 25 subtract the voltages vectorially. Thus the output from the filter from windings 22 and 24 is a voltage vector sum and from windings 23 and 25 is a voltage vector difference.

The voltages from the secondary winding of transformers 10 and 16 are coupled to a pair of transistor amplifiers 26 and 27. The voltage representing the vector sum is coupled to transistor amplifier 26 and the voltage representing the vector difference is coupled to transistor amplifier 27. The outputs from each of the amplifiers have the same phase shift as the inputs to the amplifiers. The output signal from the amplifiers are inductively coupled to the input of discriminator 28. The discriminator 28 is a Foster-Seeley type. The voltage output from amplifier 26 is inductively coupled from the resonant circuit 29 to the secondary 31 and 32 which is connected across diodes 36 and 37. The output of amplifier 27 is inductively coupled from resonant circuit 33 to the secondary of the coupling transformer 35 which is coupled to the center tap of secondary 31, 32 and across diodes 36 and 37. The rectified voltage developed by diodes 36 and 37 is formed across load resistors 40 and 41. Capacitors 38 and 39 are filter capacitors that smooth the R.F. ripple component.

Each of the crystals 7 and 13 in the filter circuit has both a series resonance frequency and a parallel resonance or antiresonance frequency. The series resonance frequency of the crystals differ from each other by any suitable frequency spacing such, for example, as 100 c.p.s. The circuit is designed so that crystal 7 having the higher series resonance frequency operates at the lower half-power point on its frequency response curve when the input signal is at the center frequency of the filter. Crystal 13 having a lower series resonance frequency operates at the upper half-power point on its frequency response curve when the input signal is at the center frequency of the filter.

The capacitors 19 and 20 are adjusted to change the frequency response of the crystals 7 and 13 respectively. The adjustment of capacitor 19 shifts the rejection notch at the antiresonance frequency of crystal 7 to a new frequency above the passband of the filter. The adjustment of capacitor 20 shifts the rejection notch at the antiresonance frequency of crystal 13 to a new frequency below the passband of the filter.

Referring to FIG. 1, the voltage signal across the secondary winding 3 is 180° out of phase with the signal across secondary winding 4. When the frequency of the input signal is at the center frequency of the filter, the signal across the primary 9 leads the input signal across secondary 3 by 45° and the signal across the primary 15 lags the input signal across secondary 4 by 45°. The signals across primaries 9 and 15 are therefore 90° out of phase.

Figure 2A:
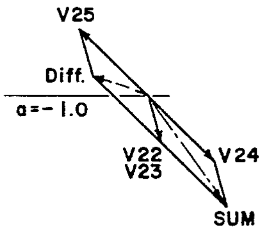
Figure 2B:
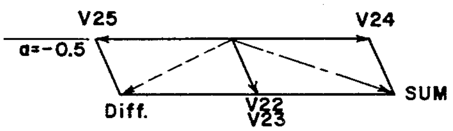
Figure 2C:
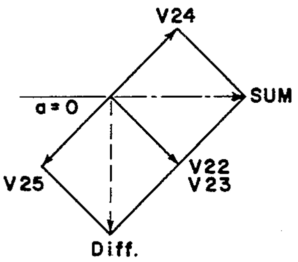
Figure 2D:
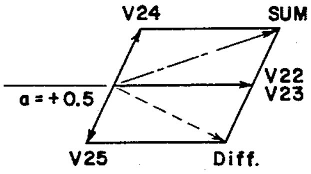

The 90° phase relationship between the two parts of the filter is shown vectorially in FIG. 2*c* by the voltage relationship between the voltage signals across the secondaries 22, 23, 24 and 25. The letter "*a*" is defined as being equal to the Q of the filter circuit times the number of cycles off resonance divided by the resonance frequency. The resonance frequency for the filter is considered to be the center frequency thereof. Thus at center frequency the value of "*a*" is equal to zero.

FIGS. 2*a* through 2*e* show that the phase and amplitude of the signals across secondaries 22 and 24 vary as the frequency of the input signal changes above and below the center frequency of the filter. The phase of the signals across coils 22 and 24 varies from 90° above and below the center frequency and is equal to 90° at the center frequency.

The two voltages vector outputs from the filter of FIG. 1 are added to produce a sum vector. This sum vector corresponds to adding voltage outputs from secondaries 22 and 24 and is noted on the vector diagrams, FIGS. 2*a* through 2*e*, as the "Sum" vector. The difference vector is the sum of the voltage outputs from secondaries 23 and 25 and is noted as the "Diff" vector. This difference vector is equal to the vector difference between the voltages across 22 and 24. The sum output from coils 22 and 24 is connected through the transistor amplifier 26 to one input of the phase detector or discriminator. The difference voltage vector is supplied through the second transistor amplifier 27 to the other phase detector input.

Figure 2E:
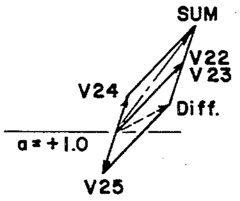

As the frequency to the filter is varied, the phase relationship between the sum vector and the difference vector changes as shown in FIGS. 2*a* through 2*e*. At a frequency below the filter center frequency indicated in FIG. 2*a*, the difference vector is small and nearly 180° out of phase with the sum vector. As the frequency is increased toward center frequency the difference vector as shown in FIG. 2*b* increases in size and rotates in a clockwise direction. As the same time, the sum vector is larger and is increasing more slowly in amplitude as it rotates also in a clockwise direction at a slower rate than the difference vector. At the center frequency (FIG. 2*c*), the two vectors are equal in amplitude and are at a relative phase angle of 90°. As the input signal goes still higher in frequency, both vectors continue to rotate clockwise and to decrease in amplitude until they are small and nearly in phase as shown in FIG. 2*e*. This variation in phase and amplitude produces a typical phase detector curve at the output of the discriminator which is a function of frequency. The sum of the voltages from the filter circuit gives the normal filtering action while the difference voltage gives the phase relationship for the discriminator.

The plot of the amplitudes of the sum and difference vector is shown by FIG. 3. At center frequency when "*a*" is equal to zero, the amplitudes are the same.

The voltages across the secondaries 31 and 35 have the same phase relationship as between the sum and difference voltage vectors. FIG. 4 represents the voltages across the secondaries 31, 32 and 35, the inputs to the discriminator as V31, V32 and V35, and the resulting vectors V36 and V37 across diodes 36 and 37.

Figure 4A:
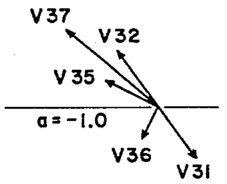
Figure 4B:
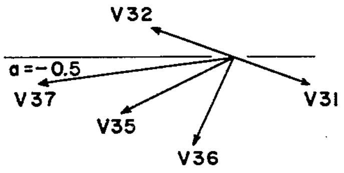
Figure 4C:
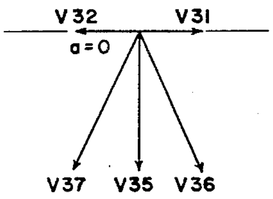

By referring to FIG. 4*c*, the resultant voltage across diodes 36 and 37 have equal amplitude, therefore the voltages across resistors 40 and 41 are equal but have opposite polarity. As a consequence, the voltage output from the discriminator at the center frequency of the filter or mid-frequency of the input signal is equal to zero.

When the input signal to the filter is below the center frequency, FIGS. 4*a* and 4*b* show that the voltage across diode 37 is greater than across diode 36. Since more current is drawn by diode 37, the output voltage from the discriminator has a negative polarity and is the difference between the voltage across resistors 40 and 41.

Figure 4D:
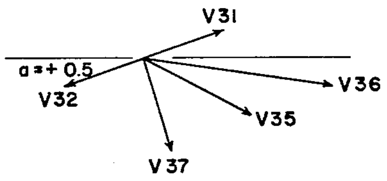
Figure 4E:
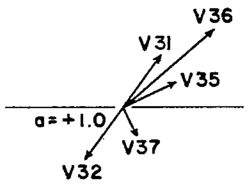

When the input signal frequency varies above the center frequency then the voltage across diode 36 is greater than across diode 37 as indicated in FIGS. 4*d* and 4*e*. In this case, the discriminator output voltage has a positive polarity governed by the voltage difference across resistors 40 and 41. As a result, the output of the discriminator is a varying D.C. voltage having the amplitude representative of the shift of the input signal frequency from the center frequency of the filter.

It is therefore apparent in the light of the foregoing description that the noise present at the discriminator is a minimum since both the sum and difference signal to the discriminator have passed through the filter.

Since the sum and difference signals to the discriminator have the required phase shift for effective discriminator action, an advantage is realized by eliminating any additional phase shifting means which would increase attenuation of the signals to the discriminator.

The principles of dual output described in this application apply equally to inductance-capacitance type filters which may also be used with phase discriminators.

Obviously many modifications and variations of the present invention are possible in the light of the above teachings. It is therefore to be understood that within the scope of the appended claims the invention may be practiced otherwise than as specifically described.

What is claimed is:

1. For use as a frequency responsive apparatus, the combination of a phase discriminator, a pair of transistor amplifiers coupled to the input of said discriminator, a dual output filter coupled to the input of said amplifiers, an input signal being applied to the input of said filter, said filter having two branches for operating on said input signal to change said input signal into two separate signals, said filter having output means for combining said separate signals into additive and difference signals having a ninety degree phase shift at the center frequency of the filter, said additive and difference signals being individually amplified and being applied to the input of said discriminator whereby the output of said discriminator is a direct current voltage of varying amplitude representing the change in frequency of the input signal from the center frequency.

2. For use as a frequency responsive apparatus, the combination of a dual output quartz crystal filter, a pair of transistor amplifiers, and a phase discriminator, said amplifier coupled to said phase discriminator, said filter coupled to said amplifiers, an input signal being applied to the input of said filter, said filter having two branches for operating on said input signal to produce two separate signals, said filter having output means for combining said separate signals into additive and difference signals constituting dual output signls having a ninety degree phase shift at the center frequency of the filter and being applied individually to said amplifiers, the amplified sum and difference signals being applied to the input of said discriminator whereby the output of said discriminator is a direct current voltage of varying amplitude representing the change in frequency of the input signal from the center frequency.

3. For use as a frequency responsive apparatus, the combination of a filter, a pair of transistor amplifiers, and a phase discriminator, said amplifier coupled to said discriminator, said filter coupled to said amplifiers, an input signal being applied to the input of said filter, said filter having two crystal means for operating on said input signal to change said input signal into two separate signals, said filter having output means for combining said separate signals into additive and difference signals constituting dual output signals having a ninety degree phase shift at the center frequency, said output means comprising a pair of tuned circuits for each of said separate signals, first and second coils coupled to one of said tuned circuits, third and fourth coils coupled to the other of said tuned circuits, said first and third coils connected in series to add the voltage signals across each coil representing said additive signal, said second and fourth coils connected in series to subtract the voltage signals across each coil representing said difference signal, said additive and difference signals being individually applied to said amplifiers and to said discriminator whereby the output of said discriminator is a direct current voltage of varying amplitude representing the change in frequency of the input signal from the center frequency.

4. The combination of claim 3, wherein said crystal means comprise a pair of quartz crystals, each of said crystals having a different resonance and antiresonance frequency in the filter, a pair of capacitors, each capacitor connected across one of said crystals respectively whereby said capacitors shift the antiresonance frequency of said crystals to a frequency outside the passband of the filter.

5. In a frequency responsive apparatus, a dual output filter, an input signal of varying frequency being applied to the input of said filter, said filter having two branches for operating on said input signal to change said input signal into two separate signals, said filter having output means for combining said separate signals into additive and difference signals having a ninety degree phase shift at the center frequency of the filter, and a phase discriminator coupled to said filter, said additive and difference signals being applied individually to the input of said discriminator whereby the output of said discriminator is a direct current voltage of varying amplitude representing the change in frequency of the input signal from the center frequency.

6. In a frequency responsive apparatus, a dual output filter and a phase discriminator, said filter coupled to said discriminator, an input signal being applied to said filter, said filter having two branches for operating on said input signal to change said input signal into two separate signals, said branches comprising a pair of quartz crystals, each of said crystals having a different resonance and antiresonance frequency, said filter having output means for combining said separate signals into additive and difference signals constituting dual output signals having a ninety degree phase shift at the center frequency, said output means comprising a pair of tuned circuits for each of said separate signals, first and second coils coupled to one of said tuned circuits, third and fourth coils coupled to the other of said tuned circuits, said first and third coils connected in series to add the voltage signals representing said additive signal, said second and fourth coils connected in series to subtract the voltage signals representing said difference signal, said additive and difference signals being applied individually to said discriminator with the minimum of noise present whereby the output of said discriminator is a direct current voltage of varying amplitude representing the change in frequency of the input signal from the center frequency.

7. In a frequency responsive apparatus, a dual output filter comprising a pair of quartz crystal means, a pair of tuned circuits, and output means, each crystal of said crystal means having a different resonance and antiresonance frequency and being connected to a tuned circuit respectively, an input signal of varying frequency being applied to said filter, said crystal means operating on said input signal to change said input signal into two separate signals, said separate signals being across each of said tuned circuits respectively, said output means coupled to said tuned circuits for combining said separate signals into additive and difference signals having a minimum of noise present and having a ninety degree phase shift at the center frequency of the filter.

8. In a frequency responsive apparatus, a dual output filter comprising an input transformer having a primary winding and a center tap secondary winding being grounded, an input signal of varying frequency being applied to said input transformer, a pair of quartz crystals, a pair of tuned circuits, one of said crystals being connected between one end of said secondary winding and one of said tuned circuits, the other of said crystals being connected between the other end of said secondary winding and the other of said tuned circuits, each of said crystals having a different resonance and antiresonance frequency in the filter, a pair of capacitors, one of said capacitors being connected across said one of said crystals and said secondary winding, the other of said capacitors being connected across said other of said crystals and said secondary winding whereby said capacitors shift the anti-resonance frequency of said crystals to a frequency outside the passband of the filter, first and second coils coupled to said one tuned circuit, third and fourth coils coupled to said other tuned circuit, a first output terminal connected to said first coil, said first and third coils connected in series to add the voltage signals across each coil, a second output terminal connected to said second coil, said second and fourth coils connected in series to subtract the voltage signals across each coil, whereby the signal at said first terminal is a voltage vector sum and the signal at said second terminal is a voltage vector difference having the minimum of noise present and a changing phase therebetween depending on the frequency of the input signal to the filter.

References Cited in the file of this patent

UNITED STATES PATENTS

| | | |
|---|---|---|
| 2,204,575 | Crosby | June 18, 1940 |
| 2,374,735 | Crosby | May 1, 1945 |
| 2,411,605 | Webb | Nov. 26, 1946 |
| 2,539,204 | Rambo | Jan. 23, 1951 |
| 2,671,851 | Houck | Mar. 9, 1954 |
| 2,878,454 | Leming et al. | Mar. 17, 1959 |
| 2,990,525 | Grant | June 27, 1961 |